United States Patent [19]

Franz et al.

[11] 4,056,656

[45] Nov. 1, 1977

[54] FLAME-RESISTANT LAMINATES

[75] Inventors: Arnold Franz, Troisdorf-Spich; Werner Stein, Troisdorf-Kriegsdorf, both of Germany

[73] Assignee: Dynamit Nobel Aktiengesellschaft, Troisdorf, Germany

[21] Appl. No.: 572,243

[22] Filed: Apr. 28, 1975

Related U.S. Application Data

[62] Division of Ser. No. 283,247, Aug. 23, 1972, Pat. No. 3,922,459.

[30] Foreign Application Priority Data

Aug. 27, 1971 Germany .............................. 2141890
May 26, 1972 Germany .............................. 2225587

[51] Int. Cl.$^2$ ..................... B32B 15/08; B32B 27/42
[52] U.S. Cl. ................................ 428/460; 428/464; 428/530; 428/531; 428/921; 428/290
[58] Field of Search ............... 428/460, 464, 530, 531, 428/921, 290

[56] References Cited

U.S. PATENT DOCUMENTS

| 2,711,380 | 6/1955 | Pintell ................................ 428/460 |
| 3,007,828 | 11/1961 | Boyer et al. ......................... 428/531 |
| 3,352,744 | 11/1967 | Elmer et al. ......................... 428/531 |
| 3,450,595 | 6/1969 | Salter et al. ......................... 428/460 |
| 3,511,748 | 5/1970 | Heeb et al. .......................... 428/530 |
| 3,624,024 | 11/1971 | Caldwell et al. .................... 260/40 R |
| 3,666,617 | 5/1972 | Marciniak ............................ 428/460 |
| T918,001 | 1/1974 | Gray et al. .......................... 260/40 R |

FOREIGN PATENT DOCUMENTS 1,364,397    8/1974    United Kingdom.

*Primary Examiner*—William R. Dixon, Jr.
*Attorney, Agent, or Firm*—Burgess, Dinklage & Sprung

[57] ABSTRACT

As an improved flame-resistant agent, pentabromodiphenyl ether and mixtures of pentabromodiphenyl ether and brominated diphenyl ethers; an agent for impregnating a mass of particles which comprises an impregnating agent, pentabromodiphenyl ether, preferably together with a plasticizer; a laminate substrate comprising a web of fibers impregnated with an impregnating agent and pentabromodiphenyl ether, said web preferably containing a plasticizer; a method of increasing the flame resistance of a continuous web impregnated with an impregnating agent which comprises including in said web pentabromodiphenyl ether.

13 Claims, No Drawings

FLAME-RESISTANT LAMINATES

This is a division of application Ser. No. 283,247, filed Aug. 23, 1972, now U.S. Pat. No. 3,922,459, of Nov. 25, 1975.

BACKGROUND OF THE INVENTION

1. FIELD OF THE INVENTION

This invention relates to an improved fire-retarding agent, to its use in connection with laminates composed of fibrous material, and to the finished articles themselves. More particularly, this invention is directed to improving the flame resistance of plastic laminates employed for printed circuits to improve their fire rating as established by industrial codes, to limit the afterburn time of ignited substrates by including in the substrates, together with an impregnating agent therefor, pentabromodiphenyl ether or a mixture thereof with other brominated diphenyl ethers.

2. DISCUSSION OF THE PRIOR ART

Plastic laminates may contain especially cellulose in the form of paper, continuous web or fiber layers as reinforcement. Such fiberboards are made by impregnating cellulose-paper webs with phenyl or cresol formaldehyde resols, with the addition of plasticizers as a rule, and hardening them in a hot press. The reinforcing, however, may also consist of slivers, laps, fabrics, mats or papers made of synthetic fiber forming materials such as polyesters or polyamides, or it may consist of glass continuous filament or glass wool. Laminates consist usually of a plurality of superimposed layers. They may be covered on one or both sides, in the same working procedure, with a metal foil, preferably copper foil, by the use of a hot glue, the purpose being to make electrical insulating material from this sandwich by known methods, to serve as supports for printed circuits, for example. Printed circuits are used in many electrical engineering and electronic applications, such as radios, television receivers, computers, etc.

For electrical applications it is particularly important that the fiberboard possess simultaneously good electrical insulating qualities, high mechanical strength and easy fabrication to printed circuits. Fabrication will be easy if the material can be cut and stamped at room temperature or with slight warming, and if the supporting material has good chemical resistance to solvents such as trichloroethylene, methyl ethyl ketone and lyes such as caustic soda solution, which are used in the manufacture of printed circuits.

Plastic laminates, however, may also be used as an interior decorating material, for example.

The following requirements in general must be met:

| | |
|---|---|
| a. Insulation resistance after 4 days 40° C, 92% relative humidity | $\geq 10^{10} \Omega$ |
| b. Electrolytic corrosion effect on metals after 4 days, 40° C, 92% relative humidity, DIN 53489 | AN 1.4 |
| c. Bending strength at 23° C | 1100 kp/cm$^2$ |
| d. Cuttability at 23° C | No cracking |
| e. Stampability at 23° C DIN 53488 | Rating 2.5 |
| f. Resistance to trichloroethylene vapor | At least 5 minutes |
| g. Resistance to 3 weight percent caustic soda lye at 40° C | At least 3 minutes |

In addition, the material must be highly flameretardant for some applications.

Fiberboards are known whose flame resistance has been improved over that of ordinary phenolic resin fiberboards by the addition of flame-retardant substances.

The flame resistance of fiberboards has hitherto been judged on the basis of ASTM D 635 and ASTM D 229, Method 1, identical with NEMA LI-1, in which a test specimen measuring 12.7 × 102 mm is mounted with its long axis horizontal and its short axis inclined 45° from the horizontal. A mark is placed at a distance of one inch from the free end opposite the mounting vise. With a bunsen burner whose blue flame has been adjusted to a length of ¾ inch, the free end of the specimen is ignited twice for a period of 30 seconds. The afterburning time from the removal of the flame to the extinction of the fire in the specimen and the distance to which the specimen burned from the tip is measured and judged.

A phenolic resin fiberboard is considered to be flame-resistant according to this ASTM Test D 635 when, in the case of type NEMA Grade FR 2, the afterburning time is less than 15 seconds and the maximum length burned is less than one inch. There are a number of types of fiberboard, especially containing flame-retardant plasticizer additives, which satisfy these requirements.

Practice, however, has shown that materials of the said flame resistance are not sufficiently flame-retardant or are not self-extinguishing with sufficient rapidity to reliably limit an appliance fire, such as a fire in a television receiver, to the location of the circuit board in which electrical faults have occurred and thus the ignition has occurred.

If such materials catch on fire in printed circuit boards which are usually in a vertical arrangement, the chimney effect which occurs in the cabinet may cause them to burn up completely in spite of the above-described flame resistance, and the fire might spread to the back wall of the cabinet and often, too, to adjacent parts of the room.

The use of improved phenolic resin laminates which satisfy the above-described quality requirements have not yet made it possible for manufacturers to counteract the frequency of fires in recent times, especially in television receivers.

A method of testing flame resistance which will take into account the way in which these laminates burn in actual practice can be achieved by holding the specimen in the vertical position rather than the horizontal position over the bunsen burner during the test. This test method UL Subject 492, Paragraph 280 A-K, has been developed by Underwriters' Laboratories, U.S.A., and contains the following details.

A specimen measuring ½ inch by 4 inches long is mounted with its long axis vertical such that the bottom edge is ⅜ inch above the top of a bunser burner of ⅜ inch diameter. The burner is adjusted with a blue flame of ¾ inch and held centrally beneath the bottom end of the specimen for a period of 10 seconds. The afterburning or afterglow is measured after removal of the flame. After complete extinction, the specimen is ignited a second time for a period of 10 seconds. The second afterburing or afterglow is also measured. Judgment of flame-resistant materials in accordance with this UL test with vertical burning is done according to two combustibility classes:

1. SE I (Self Extinguishing 1)

The average afterburning time must be equal to or less than 25 seconds. The maximum time may not exceed 30 seconds.

2. SE O (Self Extinguishing 0)

Here the average afterburning time must be equal to or less than 5 seconds and the maximum must not be greater than 10 seconds.

Material which complies with these more stringent tests and has a rating of SE I, or especially SE O, offers good passive fire protection for electrical appliances in which the insulation may be ignited in the case of trouble.

Ratings of SE I and SE O, however, can be achieved only by certain very special plastic laminates, and their composition and the additives they contain result in quality losses.

The SEO rating, for example, is achievable only on the basis of an epoxy resin, but cannot be achieved with phenol-cresol resins. Laminates bonded with epoxy resin have an incombustible glass fabric, unwoven glass fabric or cellulose paper for reinforcement. The epoxy resin is treated for flame resistance by the co-condensation of substances containing halogen, such as tetrabromobisphenol A. Partially for the purpose of enhancing flame resistance, antimony trioxide is also contained in the resin in proportions of 5 to 10% by volume.

The SE I rating can be achieved by fiberboards bonded with phenol-cresol resin, but only when either the resin or the plasticizer contains added flame-retardant substances, especially antimony trioxide. Then, however, the above-mentioned quality requirements are not achieved, and furthermore, other disadvantages result, which will be described hereinafter.

The use of mineral reinforcements or supporting materials involves difficulty in machining, because mineral substances cannot be punched easily and cause greater punch wear. Furthermore, the manufacture of such laminates is more expensive than laminates made with cellulose or paper reinforcements.

The use of antimony trioxide entails the disadvantage of making the laminate opaque, so that defects in the copper foil or conductors cannot be readily detected by inspecting them against a strong light. Furthermore, antimony trioxide, especially in large quantities, impairs the electrical and mechanical characteristics.

The addition of flame-retardant additives to phenol-cresol resin solutions or to the plasticizers used therewith generally entails the following disadvantages:

1. The electrical characteristics are greatly impaired. Insulation resistance is diminished and in particular the electrolytic corrosion effect on metals is greatly intensified, so that the material cannot be used at all as an insulator.

2. The total quantity of platicizers and flame-retardants in the impregnating solution may not exceed approximately 35 to 40% by volume, because otherwise the resin hardens poorly and loses strength. If fireproofing agents are used, therefore, the quantity of plasticizers must simultaneously be reduced, but this gives the end product poorer stamping and cutting qualities. Embrittlement,too, is produced by the fact that numerous fireproofing agents decompose in the heating involved in the pressing procedure, thereby impairing the hardening of the resin.

3. The addition of flameproofing agents also results in the danger of rendering the impregnating solution turbid by the partial coagulation of plasticizers or resin components from the solution. This also impairs the hardening or setting of the resin and diminishes strength.

4. The flame retardants are incompatible or compatible only in small amounts with phenolic resin solutions and plasticizers, producing the effect described in Point 3.

Comparison Experiments 6 to 8 below show these disadvantages in detail when they are compared with Examples 1 to 5.

In view of the above it was heretofore generally accepted that it was impossible to provide a laminate with an SE O rating which laminate comprised a phenol-resol resin.

Specifically, those skilled in the art might have expected to achieve this aim with a mineral reinforcement and with copolymerizable flame retardant substances. However, it did not appear that it could be done with reinforcement on a cellulose base using known flameproofing agents. It was to be furthermore expected that there would be provided an impairment of the electrical, mechanical and fabricating qualities to the point where the material would be barely usable, if the difficulties described with regard to the manufacture of the laminates were overcome.

On account of the disadvantages listed as Points 1 to 4, supra, the art expected to obtain a usable flameresistant laminate with copolymerizable flame-retardant substances, but not with substances which remain in their molecular form.

SUMMARY OF THE INVENTION

Broadly, this invention contemplates as a flameretarding agent pentabromodiphenyl ether in a solvent. In a particularly desirable embodiment, this invention contemplates an improved composition for a mass of particles, particularly a continuous web of fibers, which composition comprises an impregnating agent for said particles and, as a flame retarding agent, pentabromodiphenyl ether or mixtures thereof with other brominated diphenyl ethers. This invention is also directed to a process for improving the flame retardancy of a laminate comprising a continuous web of fibers which comprises impregnating said web with an organic impregnating agent and pentabromodiphenyl ether or a mixture thereof with other brominated diphenyl ethers.

The present invention is based upon the finding that numerous different types of substrates can be rendered flame-resistant through the use of pentabromodiphenyl ether (hereafter called PBD) or mixtures thereof with other brominated diphenyl ethers . Thus, it has been found that the rating accorded certain cellulosic continuous webs employed as substrates for metallic overlays used in printed circuits can be increased to a SE O rating by including in the substrate PBD alone or preferably in admixture with other brominated diphenyl ethers. The PBD is preferably employed in solution form especially in a form wherein it is in contact with a solvent, such as an ether, an alcohol, a hydrocarbon or a ketone as more fully described below. Thus, substrates from sand cores to continuous webs of cellulose fibers can be treated with PBD and a solvent to render them flame-resistant. However, the principal use of PBD pursuant to the claimed invention is in the treatment of particular types of continuous webs of staple, cellulosic fibers which are impregnated with a phenol-cresol resin to provide body to the fibers and render them useful as a fiberboard or a substrate onto which is laminated a copper or other electrically conductive sheet for use in the manufacture of printed circuits.

If the PBD is employed to flame-proof or flame-retard a particular composition, the same can have a particle size between 0.5 and 2000 microns, determined by measuring the shortest diameter across the particle. Preferably, the particles contain a binding agent or impregnating agent to cohere the same together, such as those agents used in the preparation of sand cores, notably urea formaldehyde resins.

As indicated above, the PBD can be used in connection with any suitable substrate, especially a substrate of a staple fibrous composition in the form of a continuous web. The web can be made of woven or unwoven fibers. In the case of a web made of unwoven fibers, the staple length of the fibers can vary between 0.5 and 30 millimeters. Naturally, the fibers can be selected from one or more types of fibers, either natural or synthetic. Thus, the fibers can be wool, cotton, cellulose, viscose rayon, polyester, nylon, acrylic, polyalphaolefin, rayon acetate, silk, asbestos, or the like, including all natural or synthetic fibers of animal, vegetable or mineral in origin.

It is apparent, additionally, that the flameproofing agent of the present invention can be used with numerous types of impregnating agent aside from the preferred phenolcresol resin. Thus, the PBD can be used in association with urea-formaldehyde impregnating agents, urethane impregnating agents, impregnating agents based upon furan and furan derivatives, inorganic impregnating agents, as well as other impregnating agents composed of polymers, especially those of polymers prepared from a condensation reaction. Generally speaking, the relative amount of PBD in association with these other impregnating agents is about the same as the amount of PBD used in connection with a phenol-cresol resinous impregnating agent. Moreover, the PBD can be incorporated directly into the impregnating agent, and the substrate can be impregnated and flameproofed in a single operation, or alternatively, the agent can be treated in a two-step process with the impregnating agent and the flameproofing agent. The impregnating agent is generally applied, in such circumstances, in a second or subsequent step. However, it should be understood that it is within the concept of the present invention to treat a particulate mass with an adequate quantity of PBD and to thereafter treat such so treated mass with a suitable impregnating agent.

Generally speaking, the amount of PBD employed will depend upon the nature of the materials, the degree of flame-retardancy desired, the porosity of the materials, and the end use of the so treated article. However, base upon the weight of the particles treated, the PBD is present in an amount between 0,5 and 15 weight percent.

DESCRIPTION OF SPECIFIC EMBODIMENTS

It has been found that, with mixtures of brominated diphenyl ethers, that is, with flameproofing agents in molecular form, not in copolymerizable form, the highest rating of SE O can be achieved and, surprisingly, not only are the electrical and technical features unimpaired, but in part, they are even improved.

The subject of the invention is an improvement in a process for the manufacture of reinforced laminates, especially fiberboards and the like, by impregnating the same or precursors thereof with a solution containing cresol and/or phenol resins, a plasticizer and a flame-proofing agent, thereafter drying the impregnated material and effecting preliminary condensation of the resin, and hardening the superimposed layers with the application of heat and pressure to form laminates, the improvement residing in including pentabromodiphenyl ether (PBD) or mixtures of PBD and other bromination products of diphenyl either in the impregnating solution as flameproofing agents, preferably in quantities of 2 to 25% of the weight of the moisture-free substance of the impregnating solution. Thus, laminates are obtained having a high flame resistance and self-extinguishing characteristics, together with high or further improved electrical, mechanical and fabricating characteristics.

It is possible to distribute PBD of mixtures of PBD and other diphenyl ether bromination products in liquid form in the impregnating solution by stirring them, but a solutionin a solvent is preferred. The concentration of the solution can be chosen within wide limits, inasmuch as solvents having boiling points between 30° and 120° C are preferred, which solvents evaporate while the laminate is drying. Solutions of 30 to 80% by weight are desirable. All solvents which dissolve PBD wholly or partially are usable, especially ethers, alcohols, hydrocarbons and ketones, such as diethyl ether, methanol, ethanol, the propanols, pentane, hexane, benzines, benzene, acetone, and, if desired, mixtures thereof with one another or with water.

Any desired plasticizers may be added to the impregnating solution, examples being those on a basis of phthalic acid esters, sebacic acid esters, adipic acid esters, phenolic esters, sulfonated hydrocarbons, amino-carboxylic acid esters, esters of terephthalic or iso-phthalic acid. Preferred, however, are esters produced by reacting phosphoric acid with a $C_4$ to $C_{18}$ alcohol, polyvalent (polyhydroxy) alcohols, or of phosphate such as tributyl phosphate, tri-(2-ethylhexyl)-phosphate, triphenyl, tricresyl or diphenyl-cresyl phosphate, or acetals, especially those derived from aldehyde radicals of formaldehyde, acetaldehyde, propyraldehyde or of the butyraldehydes and saturated alcohols with 1 to 18 carbon atoms, or phenols, examples being diethoxy-formal, diphenoxyformal, diethoxyethylformal or di-phenoxyethylformal.

Technical pentabromodiphenyl ether has a relatively high viscosity or contains some crystals at room temperature and even at 50° C, and may be contaminated with small amounts of hexabromodiphenyl ether, so that when the solutions are stored at room temperature some crystalline separation of bromine compounds may occur, especially hexabromodiphenyl ether and higher products.

The separation of crystals may be prevented, however, by using mixtures of brominated diphenyl esters in which the bromination products tribromodiphenyl either to octabromodiphenyl ether are present. This simplifies the use of technical pentabromodiphenyl ether as fireproofing agents in connection with the manufacture of reinforced plastic laminates.

The content of the various bromination products of diphenyl ether in the mixture may vary within very wide limits, but it is important, in the meaning of the invention, that the viscosity of the mixture not exceed 9000 centipoises, at 50° C, and be between 300 and 7000 generally, but preferably below 4000 centipoises. In general, this requirement is met by mixtures in which the contents of the components are within the following limits:

Pentabromodiphenyl ether; 40 – 60 weight percent

Tetrabromodiphenyl ether; 15 – 45 weight percent
Hexabromodiphenyl ether; 1 – 20 weight percent
Octabromodiphenyl ether; 0 – 2 weight percent
Tribromodiphenyl ether; 0 – 5 weight percent As has been shown, variations from this mixture are possible, providing the viscosity of the mixture does not become too high.

The bromine content of such mixtures will generally amount to 66.0 to 70.5 weight percent, especially 67.0 to 69.5 weight percent.

In a solubility test, the stability of the solution in acetone was determined for a variety of mixture ratios which are listed in Table 1. From this table it can be seen that the desired good solubility in solvents is achieved together with the avoidance of crystallization.

TABLE A

Mixtures having good solubility and little tendency to precipitate

| Bromine Content % | Viscosity at 50° C (cp) | Acetone solution stable for 24 h | Tri- | Tetra- | Penta- | Hexa- | Higher brominated products |
|---|---|---|---|---|---|---|---|
| 67.9 | 650 | Yes | 1.5 | 53 | 42 | 3.5 | 0.2 |
| 69.0 | 1900 | Yes | 0.2 | 43 | 50 | 6 | 0.7 |
| 69.0 | 3960 | Yes | 0.1 | 35 | 55 | 9 | 0.8 |
| 69.2 | 3650 | Yes | 0.2 | 30 | 55 | 10 | 1.0 |

Pentabromodiphenyl ether should be present in quantities of 35 to 70% by weight in the mixture of diphenyl ether bromination products that is used as the fireproofing agent.

Tri-, tetra-, and hexabromodiphenyl ethers are the preferred diphenyl ether bromination products in addition to pentabromodiphenyl ether.

These above-named mixtures of bromination products can be dissolved without difficulty in the solvents mentioned, upon heating to 60° C, acetone being preferred. Solvents are added only to the extent that clear impregnating solutions are obtained, so that now high concentrations can be achieved in any case, amounting to as high as 70 and 80 weight percent solutions.

These solutions have a pot life of more than 24 hours. No components precipitate from the solutions. This results in advantages in production, in that the addition of the solutions is simplified and can be performed in higher concentrations, larger amounts of impregnating solution can be prepared and stocked, and, in particular, the continuous operation of the impregnating machines is rendered possible.

The use of the mixture of bromination products of diphenyl ether has no adverse effect on the flame resistance of the laminates, and again a rating of SE O can be achieved. Neither does it have any negative effect on technical advantages as regards mechanical strength and particularly as regards good electrical characteristics.

This invention also contemplates a laminate of high flame resistance and improved elecgrical, mechanical and working characteristics, especially fiberboard and the like which contains 35 to 65 weight percent reinforcement, e.g., cellulose fiber, and 65 to 35 weight percent of an impregnation of cresol and/or phenol resins, plasticizers and pentabromodiphenyl ether or mixtures of pentabromodiphenyl ether and other diphenyl ether bromination products as flameproofing agents, especially those in which plasticizers on a basis of phosphoric acid esters and/or acetals are contained.

Such laminates, in which fiber materials in sheet form based on natural or synthetic organic fibers, are contained as reinforcement, have especially valuable practical properties, because their flame resistance is very appreciably higher than in the same laminates without flame retarding agents, and the electrical, mechanical and working characteristics are appreciably better than those of the same laminates using flame retarding agents of other kinds.

In particular, papers such as cotton paper, preferably cotton linters papers, or papers made from sulfate or sulfite cellulose obtained from coniferous woods, yield paperboards, although fiber materials in sheet form may also consist of slivers, laps, mats or fabrics made from cellulose, fibers or webs of synthetic fibers such as polyesters, polyamides or other organic polymers. These organic substances may be replaced wholly or partially with fibrous mineral substances such as glass fibers, glass continuous filaments, mineral wool, or asbestos fibers, or partially also be non-fibrous materials such as straw, sawdust and fillers, and then serve mainly as flameproof building materials for home construction or boat building, and partially as decorative laminates for the interiors of buildings and vehicles.

The laminates of the invention may be used advantageously for all known applications of laminates.

Advantages are achieved in the manufacture of electrical insulating materials, preferably by applying metal foils to one or both sides to form boards for printed circuits. The metal foil, or metal strips, usually of copper, are pressed on, using a hot adhesive. The metal foil can also be covered with an anti-leakage material consisting, for example, of a paper impregnated with a moisture-proof melamine resin or an aliphatic or cycloaliphatic epoxy resin.

Advantages arising out of high flame resistance and easy workability are also achieved in the manufacture of decorative laminates and panelling for interior decoration. Printed or colored foils and sheet materials, etc., are often applied to one or both sides. Foils, sheet materials, fabrics, wood veneers or other covering materials impregnated with the above-named resins — so-called decorator materials — or a flame-retardant covering can be applied for the purpose of the embellishment of the surface.

The phenol formaldehyde and cresol formaldehyde resin solutions used for the impregnation may be manufactured from any desired phenols by reaction with aldehydes, especially formaldehydes and substances which form formaldehyde, and they should be of the resol type and have a synthetic resin content of 40 to 80 weight percent, preferably 50 to 60 weight percent, with reference to the synthetic resin solution. Especially desirable properties may be achieved in the fiberboards by using for the impregnation solutions those which contain both synthetic resins together.

The desirable properties of the fiberboards prepared in accordance with the invention are obtained when the addition of brominated diphenyl ether amounts to 5 15% of the weight of the mositure-free substance of the impregnating solutions. If solutions are used which contain a phenolic resin and a cresylic resin together, fiberboards are obtained which have optimum properties when the sum of the resins amounts to 60 to 90% of the total weight of synthetic resin and plasticizer in the impregnating solution, the ratio of the cresylic resin to the phenolic resin being variable from a ratio of 5:1 to a ration of 1:5. Preferably, the ratio of cresylic to phenolic resin ranges from 2:1 to 3:1. The total percentage of synthetic resin, plasticizer and flame retardant in the laminate prepared in accordance with the invention is to amount to 70 to 150%, preferably about 100 to 130%, of the weight of the non-impregnated sheet reinforcing material. A high percentage of resin in the laminate will result in good electrical characteristics.

In accordance with the invention, the dry paper or one of the other named reinforcing materials is first imbibed with the impregnating solution. This can be done simply by applying the solution with a roller, for example, or by spraying or by immersion. In continuous processes, it is advantageous to pass a web of paper through an impregnating bath. The use of the one-step process is expedient, but multiple step methods may also be used. After wetting with the impregnating solution, the paper impregnated with the synthetic resins is dried in a known manner and the synthetic resin is condensed, a drying tunnel being advantageously used for the purpose. The final hardening of the thermosetting plastic is performed in a prior art manner in a hot press with the application of a pressure of 70 to 180 kp/cm² and temperatures ranging from 130° to 180° C, preferably at about 160° to 170° C. Usually a plurality of superimposed layers of the impregnated and dried paper are pressed together in order to obtain thicker laminates. The pressing time amounts to 30 to 90 minutes.

The process of the invention for the manufacture of a flameproof fiberboard offers appreciable technical advances over known processes. The cellulose fiberboard achieves extraordinary flame-inhibiting properties of class SE O or, if only a small amount of PBD is added, class SE I, such as otherwise are achieved only with laminates containing mineral supporting or filling materials. The elimination of mineral substances simplifies manufacture and greatly improves the stampability while reducing tool wear. Furthermore, in spite of the addition of the flame-retardant additive, which usually increases conductivity, the product has extraordinarily good electrical characteristics and very low moisture absorption. The electrolytic corrosive action on metal is as low as can be achieved otherwise only by high-quality electrical fiberboards without flame-retardant additives. It is an important advantage that the fiberboard retains the customary translucency and its mechanical strength equals and sometimes even exceeds that of fiberboards which have not been flameproofed. Consequently, all available machines and processes for the manufacture of printed circuits may be used without modification for the fabrication of the new support material.

Surprisingly, it has been found that a plasticized or alcoholic-aqueous cresol or phenol formaldehyde solution (preferably solutions of the cresol type of these resins) is miscible with pentabromodiphenyl ether or mixtures of brominated diphenyl ethers in the above-stated ratio, so that no turbidity is produced in the impregnating solution and no precipitation of plasticizer or resin occurs. At the same time, PBD or the mixtures of brominated diphenyl ether serve not only as additives to improve flame resistance, but unexpectedly they also have a plasticizing action, produce an improvement in stamping qualities, and also lead to an improvement of the electrical properties and to an improvement by way of reduction of the sensitivity of the support material to moisture.

It is therefore possible to replace a portion of the plasticizers which are usually added and which are necessary if PBD or the mixtures of brominated diphenyl ethers are not used, with the brominated diphenyl ethers, as is shown especially in Example 3.

For use as a decorative laminate or lining material in boat or vehicle construction, the material manufactured in accordance with the invention has the advantage over those materials which are made with other flameproofing additives to fiberboard that it remains unaffected by sweating or condensation and thus is free from harm due to the formation of blisters.

EXAMPLE 1 a. A cotton paper delivered in rolls, having a width of 2700 mm and a specific weight of 120 g/m² was continuously unwound and passed through an impregnating bath which had the composition represented in Table 1.

For this purpose, the resin solution A, with a resin content of 50% by weight, and resin solution B, with a resin content of 70% by weight, were used, which were prepared in the following manner:

CRESOL RESIN SOLUTION A 100 weight-parts of cresol mixture were brought to the condensation reaction in a known manner with 80 weight-parts of 36 weight percent aqueous formaldehyde solution and 5 weight-parts of concentrated ammonia, at the boiling temperature.

After removing the water by distillation to a synthetic resin solution of about 80% by weight, the solution was thinned by the addition of methanol to 50% by weight. A resol resin formed whose B time, defined below, amounted to 8 minutes at 150° C and whose viscosity of the solution amounted to 55 cP at 20° C.

PHENOL RESIN SOLUTION B 100 weight-parts of phenol were polymerized with 120 weight-parts of 36 weight percent aqueous formaldehyde solution and 1 weight-part of caustic soda at the boiling temperature, in a known manner.

Then water was removed by distillation until the solid content of the resultant phenolic resol solution was 70 weight percent. The B time was 7 minutes at 150° C, the viscosity of the solution 250cP at 20° C.

The ° time was determined in the following manner:
A hemispherical depression ($r = 1$ cm) is created in the surface of a cubic orcylindrical iron block heated to 130° to 150° C. 0.15 g. of the liquid of powdered resin being tested is placed in the depression and steadily stirred with a glass rod drawn to a sharp tip. The B state or B time is reached when the filaments that can be drawn from the specimen with the glass rod break and snap back in a rubber-elastic manner.

TABLE 1

| Liquid component of the impregnating solution | Quantity of liquid component used kg | Quantity of synthetic resin and plasticizer used in impregnating solution | |
|---|---|---|---|
| | | Absolute kg | Percentage by weight of moisture-free substance |
| Crasylic resin solution A | 9.2 | 4.6 | 46 |
| Phenolic resin solution B | 3.4 | 2.4 | 24 |
| Pentabromodiphenyl ether | 1.0 | 1.0 | 10 |
| Diphenylcresyl phosphate | 2.0 | 2.0 | 20 |
| Acetone | 0.45 | — | — |

The immersion time was 30 seconds. The paper web thus moistened with the impregnating solution was passed over 2 carrier rolls and freed of excess solution by squeezing it between two steel rolls. From the rolls the web was carried on through a drying tunnel in which it was heated within 4 minutes from 150° C up to 170° C. This caused a preliminary condensation of the synthetic resins. Rectangular pieces 2800 mm long and 1300 mm wide were cut from the paper web. Eight of these sheets of paper were laid together and heated in a hot press for 60 minutes under a pressure of 100 kp/m² at 165° C. This produced a fiberboard 1.5 mm thick.

The paper content in the fiberboard was 45% by weight.

The impregnating solution was then produced by mixing the resins A and B and the plasticizer with the PBD dissolved in acetone at 60° C, in the quantity ratio stated in Table 1, by stirring at 23° C.

b. A second impregnating test was performed, which differed from the first only in that the impregnating solution contained no pentabromodiphenyl ether. The fiberboard resulting from this second test differed virtually not at all in appearance from the one made in the first test. The two fiberboards, however yield appreciably different physical values. These are summarized in Tables 2 to 4.

TABLE 2

| Test | Standard | Preliminary Treatment | Afterburning time a) | b) |
|---|---|---|---|---|
| Flame resistance, vertical | UL Subject 492, Par. 280 A-K | None | 1-6 sec. | 41-55 sec. |
| Flame resistance, vertical | UL Subject 492, Par. 280 A-K | 7 days 70° C | 1-5 sec. | 45-60 sec. |

TABLE 3

| Test | Standard | Preliminary Treatment | Stampability rating a) | b) |
|---|---|---|---|---|
| Perforation test, lengthwise | DIN 53,488 | 23° C | 2.0-2.5 | 2.1-2.7 |
| Perforation test, lengthwise | DIN 53,488 | 45° C | 1.9-2.2 | 2.0-2.5 |
| Perforation test, lengthwise | DIN 53,488 | 60° C | 1.6 | 1.6 |

TABLE 4

| Test | Standard | Test Conditions Temp. °C | Rel. Hum. % | Time h | Rating a) | b) |
|---|---|---|---|---|---|---|
| Electrolytic corrosion (pos. pole) | DIN 53,489 | 40 | 92 | 96 | AN | AN |
| Electrolytic corrosion (neg. pole) | DIN 53,489 | 40 | 92 | 96 | 1.2-1.4 | 1.4-1.6 |
| Internal resistance | DIN 7735 | 40 | 92 | 96 | 2 to 10 × 10¹⁰ | 1 to 5 × 10¹⁰ |

AN = slight discoloration

TABLE 5

| Test | Standard | Immersion Conditions Temp.° C | Time h | Water Absorption in mg a) | b) |
|---|---|---|---|---|---|
| Water absorption | DIN 7735 | 23 | 24 | 17-21 | 18-22 |
| Water absorption | DIN 7735 | 23 | 96 | 45-51 | 47-53 |

EXAMPLE 2

A cotton paper such as was used in Example 1 was impregnated in the same manner and with the same synthetic resins as in Example 1, except that the impregnating solution contained only 1.5 kg of diphenyl cresyl phosphate instead of 2 kg, and the balance of 0.5 kg consists of the plasticizer diethoxyethyl formal. This plasticizer is known to improve stamping qualities, but it increases the tendency of the support material to burn. Here, again, the impregnation was performed once with the addition of 1.0 kg of pentabromodiphenyl ether and once without this additive. After preliminary condensation followed by hardening in a hot press, the differences found were similar to those of Example 1 in regard to physical properties, especially flame resistance.

EXAMPLE 3

Both a cotton paper and a paper consisting of sulfate cellulose made from spruce wood were coated as described in Example 1, but with 35 weight percent plasticizer and flame-proofing agent, 24 weight percent phenolic resin B and 41 weight percent cresylic resin A in the impregnating solution.

In the following tables, PBD stands for pentabromodiphenyl ether, DPK for diphenylcresyl phosphate, each expressed in percent by weight of moisture-free substance in the impregnating solution. NB is the afterburning time in the first and second test in accordance with UL 492 in seconds, St23° represents the stampability at 23° C in accordance with DIN 53,488, EK represents the electrolytic corrosion in accordance with DIN 53,489, IW.10¹⁰ the internal resistance (insulation resistance) in 10¹⁰ ohms in accordance with DIN 7735 at 40° C and 92% relative humidity.

As in the case of Example 1, the stampability, the electrolytic corrosion, and above all the internal resistance are surprisingly even better than those of the specimen that is free of PBD; the other mechanical characteristics are unaffected

TABLE 6

| PBD | DPK | NB | St23° | E | IW·10¹⁰ | Fire Rating |
|---|---|---|---|---|---|---|
| 0 | 35 | 47/30 | 2.2 | AN 1.6 | 1.4 | SB |
| 5 | 30 | 4/12 | 2.1 | AN 1.6 | 0.8 | SE I |
| 10 | 25 | 2/7 | 2.0 | AN 1.2 | 2.5 | SE O |
| 15 | 20 | 2/4 | 2.0 | AN 1.2 | 3.7 | SE O |
| 20 | 15 | 2/5 | 2.0 | AN 1.2 | 3.6 | SE O |

SB = slow burning

With a little as 5% PBD, accordingly, the rating of SE I is achieved, and with 10% PBD and up, the rating is SE O.

When cellulose sulfate from spruce wood was used, the stampability was slightly poorer.

EXAMPLE 4

As in Example 3, but with a change of reinforcement, a specimen was tested whose reinforcement consisted of 30 weight percent glass fibers (GF) of 0.01 mm diameter 6 cm long, and 70 weight percent cotton linters (CP), and compared with a specimen containing no PBD and having a reinforcement consisting only of the cellulose fibers. Here, again, the electrical characteristics were improved by PBD.

This example was varied, PBD being added to the impregnating solution in the form of solutions of 40% and 60% by weight in acetone, methanol and diethyl ether, and in the form of an aqueous-alcoholic dispersion. This produced no effect on the measurements obtained from the fiberboards produced in this manner.

TABLE 7

| CP | GF | PBD | DPK | NB | St23° | EK | IW·10$^{10}$ | Fire rating |
|---|---|---|---|---|---|---|---|---|
| 100 | 0 | 0 | 35 | 47/30 | 2.1 | AN 1.6 | 1.4 | SB |
| 70 | 30 | 10 | 25 | 1/4 | 2.6 | AN 1.2 | 3.5 | SE O |

Similar results were obtained when the same quantities of tricresyl phosphate, triphenyl phosphate, tris-(butoxy-ethyl)-phosphate and tri-(2-ethylhexyl)-phosphate were used instead of the DPK as plasticizer.

EXAMPLE 5

A procedure similar to Example 3 was followed, but part of the DPK was replaced with diethoxyethyl formal (DEF). If large proportions of DEF are used, the SE O rating is no longer achieved, but advantages result from the resistance of the product to alkalies.

TABLE 8

| PBD | DPK | DEF | NB | St23° | Fire Class |
|---|---|---|---|---|---|
| 0 | 25 | 10 | 41/>100 | 2.4 | SB to FB |
| 15 | 15 | 5 | 2/6 | 2.2 | SE O |
| 15 | 10 | 10 | 18/14 | 2.3 | SE I |

FB = fast burning
SB = slow burning

EXAMPLES 6, 7 and 8 (COMPARISON EXAMPLES)

Example 1 was repeated, the impregnating solution being composed as follows:

| | | |
|---|---|---|
| Cresylic resin solution A | 46% | solids in the impregnating sol. |
| Phenolic resin solution B | 24% | " |
| Diphenylcresylphosphate | 20% | " |
| F 1, 2, 3 | 15% | " |

The flameproofing agents F 1, F 2 and F 3 were tris-(2,3-dibromopropyl)-phosphate, tribromophenyldibromopropyl ether and the polymeric organophosphate compound "Phosgard T 22 R" of Monsanto, which is essentially characterized by the recurrent

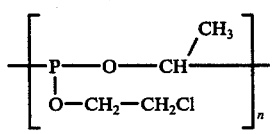

The following results were obtained:

| Flameproofing agent | IW | S23° | S60° | St23° | St60° | EK | A |
|---|---|---|---|---|---|---|---|
| F 1 | 2 10$^8$ | cracked | | 3.8 | 3.0 | B 1.8 | clear |
| F 2 | 6 10$^7$ | cracked | | 2 | 3 | B 1.9 | cloudy |

-continued

| Flameproofing agent | IW | S23° | S60° | St23° | St60° | EK | A |
|---|---|---|---|---|---|---|---|
| F 3 | 7 10$^7$ | cracked | | 5 | 4 | B 3.5 | clear |

S 23° and S 60° represent cutting quality using the guillotine shear and St 23° and St 60° represent stamping quality in accordance with DIN 53,488; EK represents electrolytic corrosion in accordance with DIN 53,489, and A the appearance of the impregnating solution thus prepared. B represents great discoloration and the occurrence of corrosion products at the anode.

When organic bromine compounds similar to PBD are used, and when Phosgard is used, therefore, the advantages of Examples 1 to 5 are not achieved, and instead a number of disadvantages are encountered (cf. points 1 to 4). The laminates thus prepared are therefore unusable as insulating materials. In particular, the electrical insulation resistance has diminished by 2 to 3 powers of 10, and the electrolytic corrosion is greatly increased. Furthermore, stamping quality is poorer and cracking occurs in the cutting test (Disadvantage 2), and, in the case of Example 7, the solution becomes cloudy (Disadvantage 3).

EXAMPLE 9

In the manufacture of the flame-resistant plastic laminate, the same procedure was followed as above in Example 1, but instead of pentabromodiphenyl ether, a mixture of the below stated composition was used, resulting in the following impregnating solution:

TABLE 10

| | | Amount of synthetic resin or plasticizer in the impregnating solution | |
|---|---|---|---|
| Liquid component of impregnating solution | Amount of liquid components used kg | Absolute kg | Weight percent with reference to the moisture-free substance kg |
| Cresylic resin solution A | 9.2 | 4.6 | 46 |
| Phenolic resin solution B | 3.4 | 2.4 | 24 |
| Tribromodiphenyl ether | 0.02 | 0.02 | 0.2 |
| Tetrabromodiphenyl ether | 0.41 | 0.41 | 4.1 |
| Pentabromodiphenyl ether | 0.50 | 0.50 | 5.0 |
| Hexabromodiphenyl ether | 0.07 | 0.07 | 0.7 |
| Diphenylcresyl phosphate | 2.0 | 2.0 | 20 |
| Acetone | 0.45 | — | — |

The laminate prepared has the following characteristics:

TABLE 11

| Test | Standard | Preliminary Treatment | Afterburning Time a) | b) |
|---|---|---|---|---|
| Flame resistance, vertical | UL Subject 492, Par. 280 A-K | None | 1–5 sec. | 41–55 sec. |
| Flame resistance, vertical | " | 7 days 70° C | 1–6 sec. | 45–60 sec. |

TABLE 12

| Test | Standard | Preliminary Treatment | Stampability Rating a) | b) |
|---|---|---|---|---|
| Perforation, longitudinal | DIN 53488 | 23° C | 2.0–2.3 | 2.1–2.7 |
| Perforation, | | | | |

TABLE 12-continued

| Test | Standard | Preliminary Treatment | Stampability Rating a) | b) |
|---|---|---|---|---|
| longitudinal Perforation, | DIN 53488 | 45° C | 1.9–2.1 | 2.0–2.5 |
| longitudinal | DIN 53488 | 60° C | 1.5 | 1.6 |

TABLE 13

| Test | Standard | Test Conditions Temp. °C | Rel. Hum. % | Time h | Rating a) | b) |
|---|---|---|---|---|---|---|
| Electrolytic Corrosion (Pos.Pole) | DIN 53489 | 40 | 92 | 96 | AN | AN |
| Electrolytic Corrosion (Neg.Pole) | DIN 53489 | 40 | 92 | 96 | 1.2–1.4 | 1.4–1.6 |
| Internal Resistance | DIN 7735 | 40 | 92 | 96 | $1$–$8 \cdot 10^{10}$ | $1$–$5 \cdot 10^{10}$ |

AN = slight discoloration

TABLE 14

| Test | Standard | Immersion Conditions Temp. °C | Time, h | Amount of Moisture Absorbed, in mg a) | b) |
|---|---|---|---|---|---|
| Moisture Absorption | DIN 7735 | 23 | 24 | 16–22 | 18–22 |
| Moisture Absorption | DIN 7735 | 23 | 96 | 46–55 | 47–53 |

EXAMPLE 10

Example 1 was repeated, but the quantities listed in Table 1 of the brominated diphenyl ethers were dissolved in 0.55 kg of diethyl ether before being added to the resin solutions. In another variant, instead of one kg of the brominated diphenyl ether listed in Example 1, a mixture of 0.04 kg of tribromodiphenyl ether, 0.30 kg of tetrabromodiphenyl ether, 0.58 kg of pentabromodiphenyl ether and 0.07 kg of hexabromodiphenyl ether, plus small amounts of octabromodiphenyl ether were used, dissolved in (a) 50 kg acetone, (b) 57 kg methanol, and (c) 60 kg light benzine.

In none of the cases was there any component that crystallized at room temperature. The technical data are the same as those given in Tables 2 to 5.

EXAMPLE 11

This is the same as Example 1, but with a mixture of brominated diphenyl ethers composed of 6 weight percent tribromo, 32 weight percent tetrabromo, 51 weight percent pentabromo, 10 weight percent hexabromo, and 1 weight percent octabromo diphenyl ether, and the amount of the mixture (MM) was varied. The following results were obtained:

| MM | DKP | NB | ST 23° | EK | IW·$10^{10}$ | B |
|---|---|---|---|---|---|---|
| 0 | 35 | 55/34 | 2.3 | AN 1.6 | 2.5 | SB |
| 5 | 30 | 6/14 | 2.2 | AN 1.6 | 1.1 | SE I |
| 10 | 25 | 3/7 | 2.1 | AN 1.4 | 2.1 | SE O |
| 15 | 20 | 2/5 | 2.0 | AN 1.2 | 3.0 | SE O |
| 20 | 15 | 2/4 | 2.0 | AN 1.2 | 3.8 | SE O |

In the above table, DKP represents dicresylphosphate, NB the afterburning time according to UL 492 in seconds in the first and second test, St 23° the stampability in accordance with DIN 53488, EK the electrolytic corrosion in accordance with DIN 53489, IW.$10^{10}$ the internal resistance in $10^{10}$ ohms in accordance with DIN 7735 at 40° C and 92% relative humidity, and B the fire rating.

What is claimed is:

1. A flame-retardant laminated comprising a first layer, which first layer comprises between 35 and 65% by weight continuous layer of paper, the balance comprising a mixture of a synthetic resin of cresol or phenol, a plasticizer and pentabromodiphenyl ether alone or in a admixture with another brominated diphenyl ether, the amount of brominated diphenyl ether being between 5 and 15% based upon the weight of the moisture-free synthetic resin, the total percentage of brominated diphenyl ether amounting to between 5 and 15% by weight based upon the weight of moisture-free synthetic resin and plasticizer, and a second layer laminated to said first layer.

2. A laminate according to claim 1, wherein the second layer is an electrically conductive substance.

3. A laminate according to claim 2 wherein said electrically conductive substance is a metal foil.

4. A laminate comprising at least one layer of paper, which paper is coated with a coating of synthetic resin, which coating contains pentabromodiphenyl ether, said synthetic resin being a condensation polymer of formaldehyde with cresol or phenol formed under alkaline conditions, said pentabromodiphenyl ether being present in an amount of between 0.5 and 15 weight percent based on the weight of said substrate, said paper having a second layer laminated thereto.

5. A laminate according to claim 4 wherein there are a plurality of superimposed layers of paper.

6. A laminate according to claim 4 wherein said paper is a cellulosic paper web.

7. A laminate according to claim 6 wherein said paper is reinforced by silvers, laps, fabrics, mats or papers of synthetic fibers, glass fibers or glass wool.

8. A laminate according to claim 4 wherein said second layer is an electrically conductive substance.

9. A laminate according to claim 8 wherein said electrically conductive substance is a metal foil.

10. A laminate according to claim 4 which contains a plasticizer, said plasticizer being selected from the group consisting of an ester of phthalic acid, an ester of sebacic acid, an ester of adipic acid, an ester of phenolic acid, a sulfonated hydrocarbon, an ester of an aminocarboxylic acid, an ester produced by reacting phosphoric acid with a $C_4$ to $C_{18}$ alcohol, a polyvalent alcohol, tributyl phosphate, tri-(ethylhexyl) phosphate, triphenyl phosphate, tricresyl phosphate, diphenylcresyl phosphate, an acetal derived from formaldehyde, an acetal derived from acetaldehyde, an acetal derived from propylaldehyde, an acetal derived from butyraldehyde, a saturated alcohol having between 1 and 18 carbon atoms, diethoxyformal, diphenoxyformal, diethoxyethylformal and diphenoxyethylformal, said pentabromodiphenyl ether being present together with other brominated diphenyl ethers such that the relative amounts fall within the following range:

Pentabromodiphenyl ether; 40–60 weight percent
Tetrabromodiphenyl ether; 15–45 weight percent
Hexabromodiphenyl ether; 1–20 weight percent
Tribromodiphenyl ether; 0–5 weight percent
Octabromodiphenyl ether; 0–2 weight percent,
the mixture having a bromine content between 66.0 and 70.5 weight percent.

11. A laminate comprising at least one layer of a paper, which paper is coated with a coating of a synthetic resin, which coating contains pentabromodiphenyl ether, said synthetic resin being a condensation polymer of formaldehyde with cresol or phenol formed under alkaline conditions, said pentabromodiphenyl ether being present in an amount of between 0.5 and 15 weight percent based on the weight of said paper, said paper having laminated thereto a layer of a metal foil.

12. A laminate according to claim 11 wherein the metal foil is electrically conductive.

13. A laminate according to claim 12 wherein said electrically conductive metal foil is made of copper.

* * * * *

UNITED STATES PATENT AND TRADEMARK OFFICE
CERTIFICATE OF CORRECTION

PATENT NO. : 4,056,656
DATED : November 1, 1977
INVENTOR(S) : Arnold Franz et al It is certified that error appears in the above-identified patent and that said Letters Patent are hereby corrected as shown below:

Priority, "2141890" should read -- 2142890 --.

Column 1, line 25, "phenyl" should read -- phenol --.

Column 2, line 17, insert -- has -- after "specimen".

Column 4, lines 26-27, "flameresistant" should read -- flame-resistant --.

Column 4, lines 31-32, "flameretarding" should read -- flame-retarding --.

Column 5, line 22, insert -- whether -- before "of".

Column 5, line 27, "phenolcresol" should read -- phenol-cresol --.

Column 6, line 17, "solutionin" should read -- solution in --.

Column 6, line 53, "esters" should read -- ethers --.

Column 6, lines 54-55, "either" should read -- ether --.

Column 8, line 60, "mositure" should read -- moisture --.

Column 9, line 55, "pentabromodiohenyl" should read -- pentabromodiphenyl --.

UNITED STATES PATENT AND TRADEMARK OFFICE
CERTIFICATE OF CORRECTION

PATENT NO. : 4,056,656
DATED : November 1, 1977
INVENTOR(S) : Arnold Franz et al It is certified that error appears in the above-identified patent and that said Letters Patent are hereby corrected as shown below:

Column 10, line 45, "°" should read -- B --.
Column 10, line 48, "of" should read -- or --. (2nd Occurrence)
Column 10, line 61, "Crasylic" should read -- Cresylic --.
Column 12, line 58, "a" should read -- as --.
Column 13, line 55, insert -- grouping -- after "recurrent".
Column 16, line 6, "laminated" should read -- laminate --.
Column 16, line 11, delete "a" before -- admixture --.
Column 16, line 38, "silvers" should read -- slivers --.

Signed and Sealed this

Twenty-eighth Day of March 1978

[SEAL]

Attest:

RUTH C. MASON
Attesting Officer

LUTRELLE F. PARKER
Acting Commissioner of Patents and Trademarks

Page 2 of 2 pages.